(12) United States Patent
Yoo et al.

(10) Patent No.: US 6,787,270 B2
(45) Date of Patent: Sep. 7, 2004

(54) PHOTO MASK FOR PATTERNING A LIGHTNING ROD

(75) Inventors: Soon Sung Yoo, Kumi-shi (KR); Seong Su Lee, Kumi-shi (KR); Dong Yeung Kwak, Taegu-shi (KR); Yong Wan Kim, Kumi-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 373 days.

(21) Appl. No.: 09/893,966

(22) Filed: Jun. 29, 2001

(65) Prior Publication Data

US 2002/0086219 A1 Jul. 4, 2002

(30) Foreign Application Priority Data

Dec. 29, 2000 (KR) ..................................... P2000-86011

(51) Int. Cl.[7] .............................. G03F 9/00; G03C 5/00
(52) U.S. Cl. .......................... 430/5; 430/311; 430/396
(58) Field of Search ........................... 430/5, 311, 396; 378/34, 35; 716/19, 21

(56) References Cited

U.S. PATENT DOCUMENTS

| 6,025,891 | A | * | 2/2000 | Kim ............................. 349/40 |
| 6,265,756 | B1 | * | 7/2001 | Brockett et al. ............ 257/555 |
| 6,365,303 | B1 | * | 4/2002 | Hung et al. ................... 430/5 |

* cited by examiner

Primary Examiner—Mark F. Huff
Assistant Examiner—Saleha Mohamedulla
(74) Attorney, Agent, or Firm—McKenna Long & Aldridge LLP

(57) ABSTRACT

A photo mask for patterning a lightning rod includes a shorting bar pattern and a plurality of pad patterns, an outer lightning rod pattern connected to the shorting bar pattern, an inner lightning rod pattern connected to the pad pattern, projections from each of the outer and inner lightning rod patterns, and a fine pattern in a "⊢" shape connected between the projections, or a redundancy fine pattern connected between the pad patterns, or a plurality of the lightning rod patterns connected in series, thereby protecting the photo mask for patterning a lightning rod from damage from static electricity, and permitting patterning of an accurate lightning rod.

17 Claims, 8 Drawing Sheets

PHOTO MASK FOR PATTERNING A LIGHTNING ROD

CROSS REFERENCES TO RELATED APPLICATIONS

This application claims the benefit of Korean Patent Application No. 2000-86011 filed on Dec. 29, 2000, the entirety of which is hereby incorporated by reference as if fully set forth herein.

BACKGROUND OF THE INVENTION

1. Field of the Invention

The present invention relates to method for fabricating a liquid crystal display, and more particularly, to a photo mask for patterning a lightning rod which can be protected from static electricity.

2. Background of the Related Art

The liquid crystal display is provided with a liquid crystal panel having liquid crystal injected between upper and lower glass substrates, polarizing plates on both sides of the liquid crystal panel each for polarizing a light, a light source for providing a fixed back light to the liquid crystal panel, and a light plate, for displaying a video signal. The lower glass substrate of the liquid crystal panel is provided with a plurality of gate lines arranged in one direction at fixed intervals, data lines arranged in another direction perpendicular to the direction of the gate line at fixed intervals to define pixel regions, a matrix of pixel regions each formed between the gate lines and the data lines, a pixel electrode formed in each of the pixel regions, a plurality of thin film transistors each formed in a corresponding pixel region having a gate electrode connected to the gate line, a source electrode connected to the data line, and a drain electrode connected to the pixel electrode, for being turned on/off in response to a signal on the gate line, to provide a signal on the data line to the pixel electrode. The upper glass substrate is provided with a color filter layer, and black matrix or a common electrode. The foregoing upper and lower glass substrates are bonded together with a gap, and the liquid crystal is injected between the upper and lower glass substrates. There are pads at the ends of the data lines and the gate lines formed on the lower substrate, a shorting bar with a gap between it and the pads, and lightning rods between the shorting bar and the pads for protecting the thin film transistors from suffering damage caused by static electricity generated and flowing to the thin film transistor through the pad and the lines during a fabrication process. Each lightning rod has an outer lightning rod portion connected to the shorting bar, and an inner lightning rod portion connected to an inner line (pad), arranged opposite to each other with a fixed distance between the two, for causing a spark between the outer and the inner lightning rods if static electricity higher than a certain level is generated, for discharging the static electricity.

Figure 1:
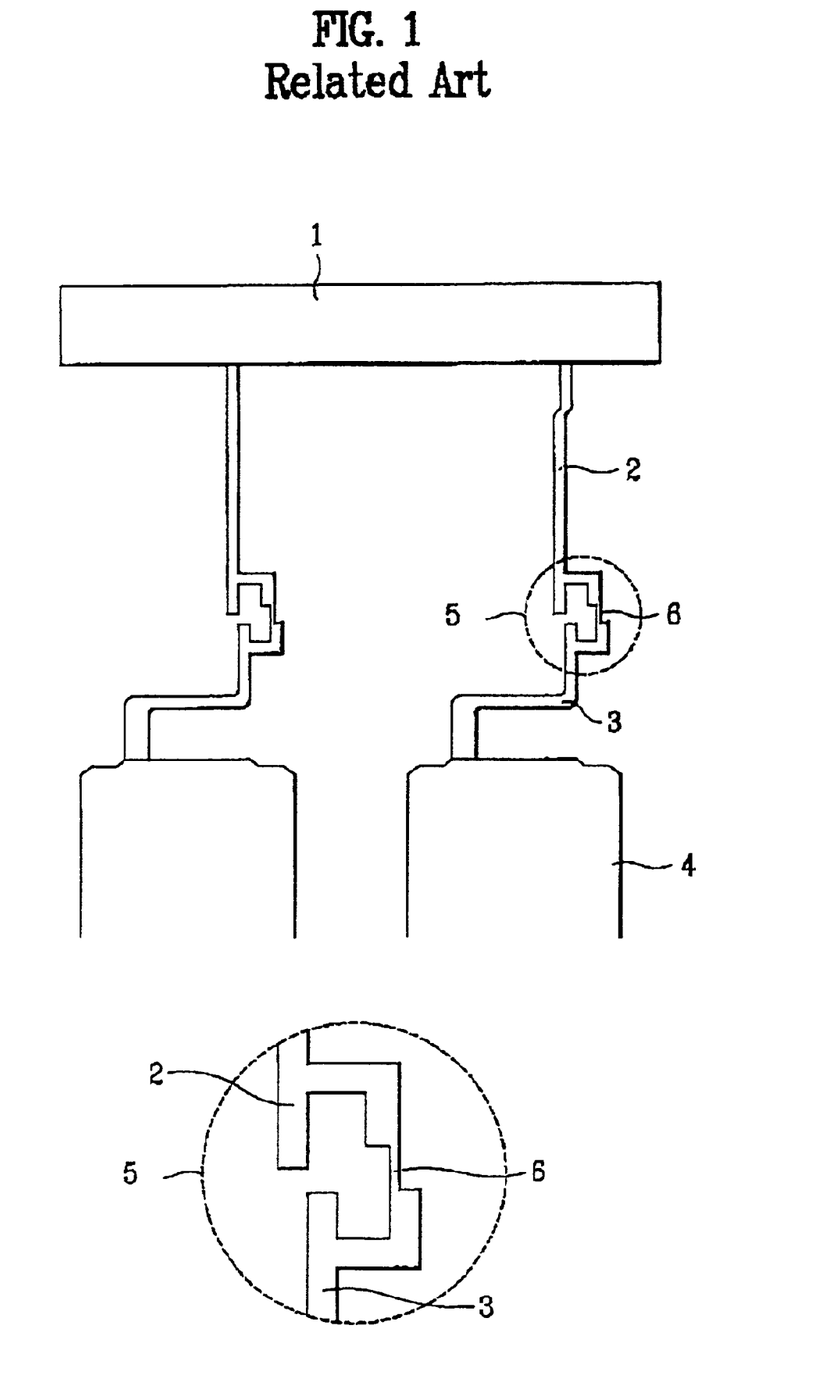
FIG. 1 illustrates a plan view of a related art photo mask for patterning a lightning rod.
Figure 2:
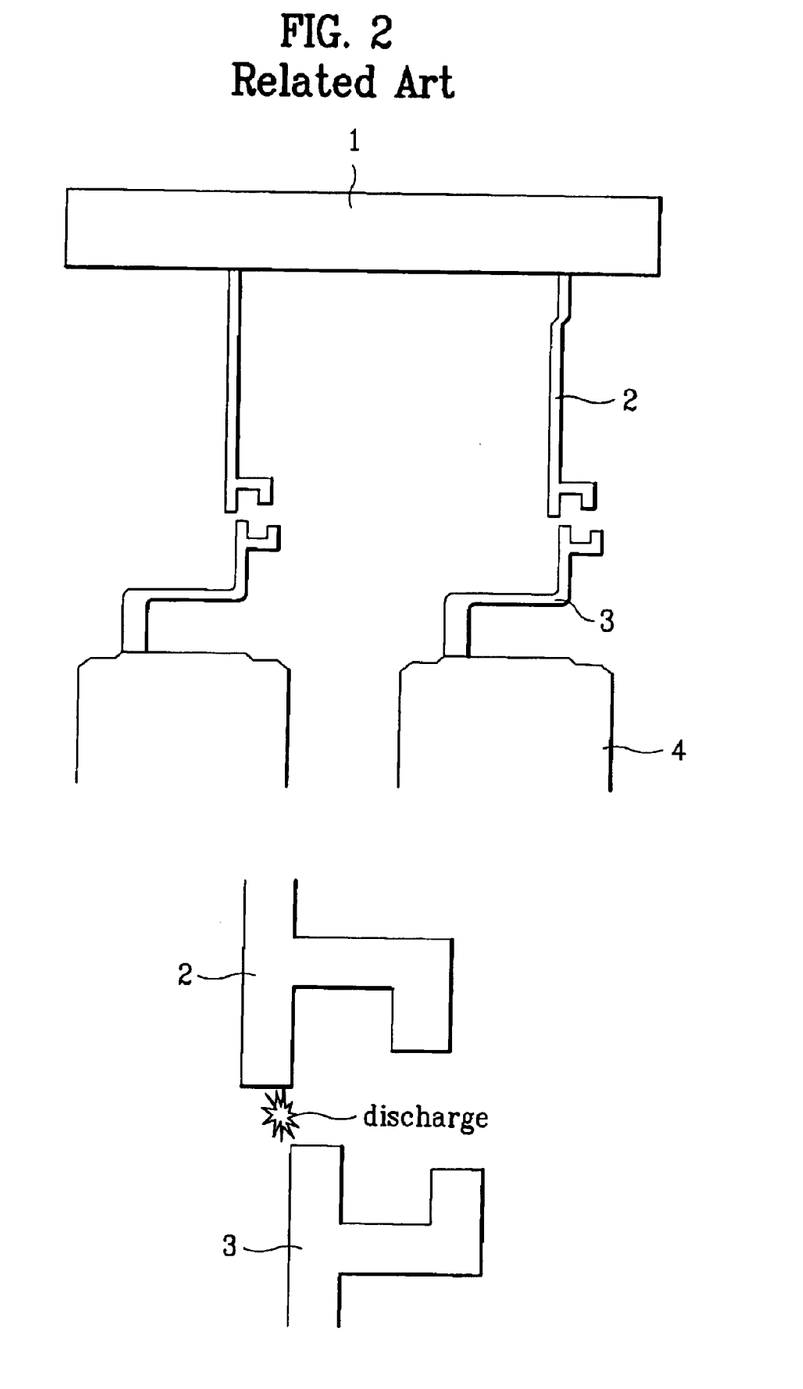
FIG. 2 illustrates a plan view of a lightning rod obtainable when exposure/development are carried out properly.
Figure 3:
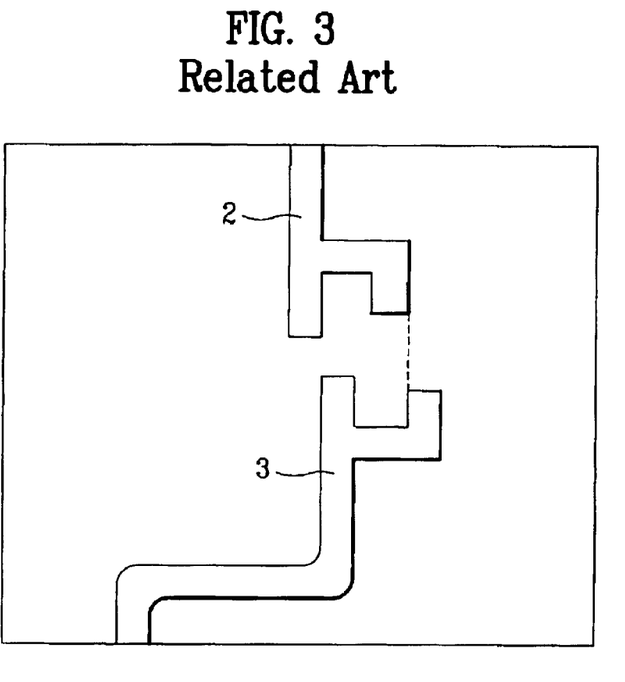
FIG. 3 illustrates a plan view of a lightning rod when a pad is short circuited, which is a problem of the related art photo mask for patterning the lightning rod.
Figure 4:
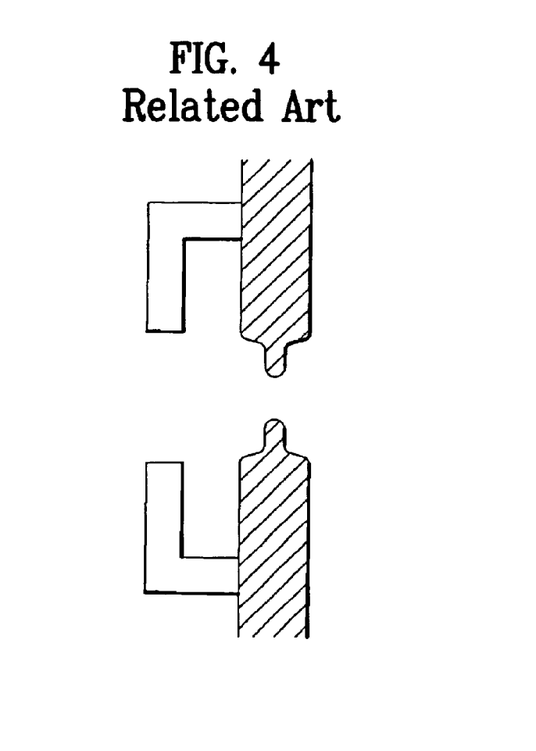
FIG. 4 illustrates a plan view of a lightning rod showing another problem of the related art photo mask for patterning a lightning rod.

The lightning rod is formed by exposure and development by using a photo mask, a structure and principle of which will be explained with reference to the attached drawings. FIG. 1 illustrates a plan view of a related art photo mask for patterning a lightning rod, FIG. 2 illustrates a plan view of an actual pattern of a normal lightning rod obtainable when exposure/development and etching are carried out by using a photo mask as shown in FIG. 1, FIG. 3 illustrates a plan view of a lightning rod when a pad is short circuited, which is a problem of the related art photo mask for patterning the lightning rod, and FIG. 4 illustrates a plan view of a lightning rod showing another problem of the related art photo mask for patterning a lightning rod.

The related art photo mask for patterning a lightning rod with a shorting bar pattern 1 and pad patterns 4 is provided with an outer lightning rod pattern 2 connected to the shorting bar pattern 1, and an inner lightning rod pattern 3 connected to the pads. The reference numeral 5 in FIG. 1 denotes the lightning rod pattern, having the outer lightning rod pattern 2 and the inner lightning rod pattern 3, arranged oppositely, each with a projection connected to the other with a fine pattern 6 for preventing static electricity in the photo mask. The fine pattern is extended from an edge of one of the projections in a diagonal direction to an edge of the other one of the projections. That is, one side of a portion of the fine pattern 6 connected to the projection forms a straight line and the other side forms a right angle. The fine pattern 6 is formed thus, for discharging static electricity generated at a cell array part of the photo mask toward an outer periphery of the mask through the fine pattern 6 and the shorting bar 1, or draining the static electricity to ground, or neutralizing the static electricity by means of an ion generator, because the static electricity may cause a spark at the lightning rod pattern 5 of the photo mask, causing the lightning pattern 5 to suffer from damage, that may cause an unwanted pattern to be formed later in fabrication of the liquid crystal display.

A method for fabricating the lightning rod in a liquid crystal display by using the foregoing photo mask will be explained.

A conduction film is deposited on a glass substrate by photolithography for forming a gate electrode, a photoresist film is deposited on the conduction film, and a photo mask as shown in FIG. 1 is used for patterning a shorting bar, pads, and a lightning rod by exposure, development, and etching. As shown in FIG. 2, if the patterning is done properly, the fine pattern 6 part of the photo mask forms no pattern on the glass substrate owing to interference and diffraction of lights in the exposure. That is, though the fine pattern connects the outer and inner lightning rods electrically on the photo mask, since the fine pattern has a very fine width, the fine pattern is not formed on an actually patterned lightning rod in a liquid crystal panel. Because the static electricity is required to be discharged, if the static electricity generated at the pads during a cell array fabrication process has a level great enough to break the thin film transistor in the cell, and because the lightning rod is required to be isolated from a driving voltage electrically, the gap between the lightening rod portions, and the shapes of the lightning rod portions, are required to be formed to correspond to a threshold value of the static electricity that is required to be discharged. That is, the smaller the gap of the lightning rods, and the sharper the lightning rods, the lower the voltage at which the spark occurs. Therefore, the gap between, and the shapes of, the lightning rods are required to be set up in designing the photo mask, and actually formed the same as the design. Accordingly, when the cell array of the liquid crystal display is formed properly actually as shown in FIG. 2, if the static electricity occurs at the pad during a cell array fabrication process, a spark occurs at the lightning rod, discharging the static electricity, and protecting the thin film transistor.

However, the foregoing related art photo mask for patterning a lightning rod in a liquid crystal display has the following problems.

First, since the very fine pattern formed between the lightning rod portions of the photo mask is susceptible to breakage such that the protection against static electricity for the photo mask can not be made, causing a spark between the lightning rod portions in the photo mask and damaging the photo mask resulting in a change in the gap or the shapes of the lightning rod portions, there may be cases when the static electricity generated at the cell array can not be prevented during fabrication of the liquid crystal display.

Second, despite the fact that the fine pattern is not intended to be formed between the lightning rods in fabrication of the liquid crystal display, there is a possibility that a fine pattern (dashed line) actually is formed between the lightning rods of cells in the liquid crystal display due to imperfect development and etching as shown in FIG. 3, causing a short with an adjacent pad, which causes trouble during electrical inspection of the cell array.

Third, though the lightning rods are required to have a fixed gap, a deformation at the part of the fine pattern acts as another lightning rod that changes the threshold voltage of the designed lightning rods.

SUMMARY OF THE INVENTION

Accordingly, the present invention is directed to a photo mask for patterning a lightning rod that substantially obviates one or more of the problems due to limitations and disadvantages of the related art.

An object of the present invention is to provide a photo mask for patterning a lightning rod, which can protect static electricity positively, and define a lightning rod structure exactly in actual patterning.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the photo mask for patterning a lightning rod includes a shorting bar pattern and a plurality of pad patterns, an outer lightning rod pattern connected to the shorting bar pattern, an inner lightning rod pattern connected to the pad pattern, projections from each of the outer and inner lightning rod patterns, and a fine pattern connected between the projections, and a redundancy fine pattern connected between the pad patterns.

In another object of the present invention, there is provided a photo mask for patterning a lightning rod including a shorting bar pattern and a plurality of pad patterns, an outer lightning rod pattern connected to the shorting bar pattern, an inner lightning rod pattern connected to the pad pattern, and projections from each of the outer and inner lightning rod patterns, and a fine pattern in a "ㅓ" form connected between the projections.

In further object of the present invention, there is provided a photo mask for patterning a lightning rod including a shorting bar pattern and a plurality of pad patterns, and a plurality of lightning rod patterns between the shorting bar pattern and the pad patterns.

In still another object of the present invention, there is provided a photo mask for patterning a lightning rod including a shorting bar pattern and a plurality of pad patterns, an outer lightning rod pattern connected to the shorting bar pattern, an inner lightning rod pattern connected to the pad pattern, and projections from each of the outer and inner lightning rod patterns, and a fine pattern connected between centers of the projections.

A distance between the projections is preferably greater than a distance between the outer lightning rod pattern and the inner lightning rod pattern.

In still further object of the present invention, there is provided a photo mask for patterning a lightning pattern including a first photo mask having a shorting bar pattern and an outer lightning rod pattern connected to the shorting bar pattern formed thereon, and a second photo mask having a pad pattern and an inner lightning rod pattern connected to the pad pattern formed thereon.

The first photo mask is a photo mask for patterning a gate line, and the second photo mask is a photo mask for patterning a data line.

In still yet further object of the present invention, there is provided a photo mask for patterning a lightning pattern including a first photo mask including a shorting bar pattern and a plurality of pad patterns, an outer lightning rod pattern connected to the shorting bar pattern, an inner lightning rod pattern connected to the pad pattern, and projections from each of the outer and inner lightning rod patterns, and a fine pattern connected between centers of the projections, and a second photo mask having a contact hole at a position matched to the fine pattern on the first photo mask.

The first photo mask is a photo mask for patterning a gate line, and the second photo mask is a photo mask for patterning a pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

First Embodiment

Figure 5:
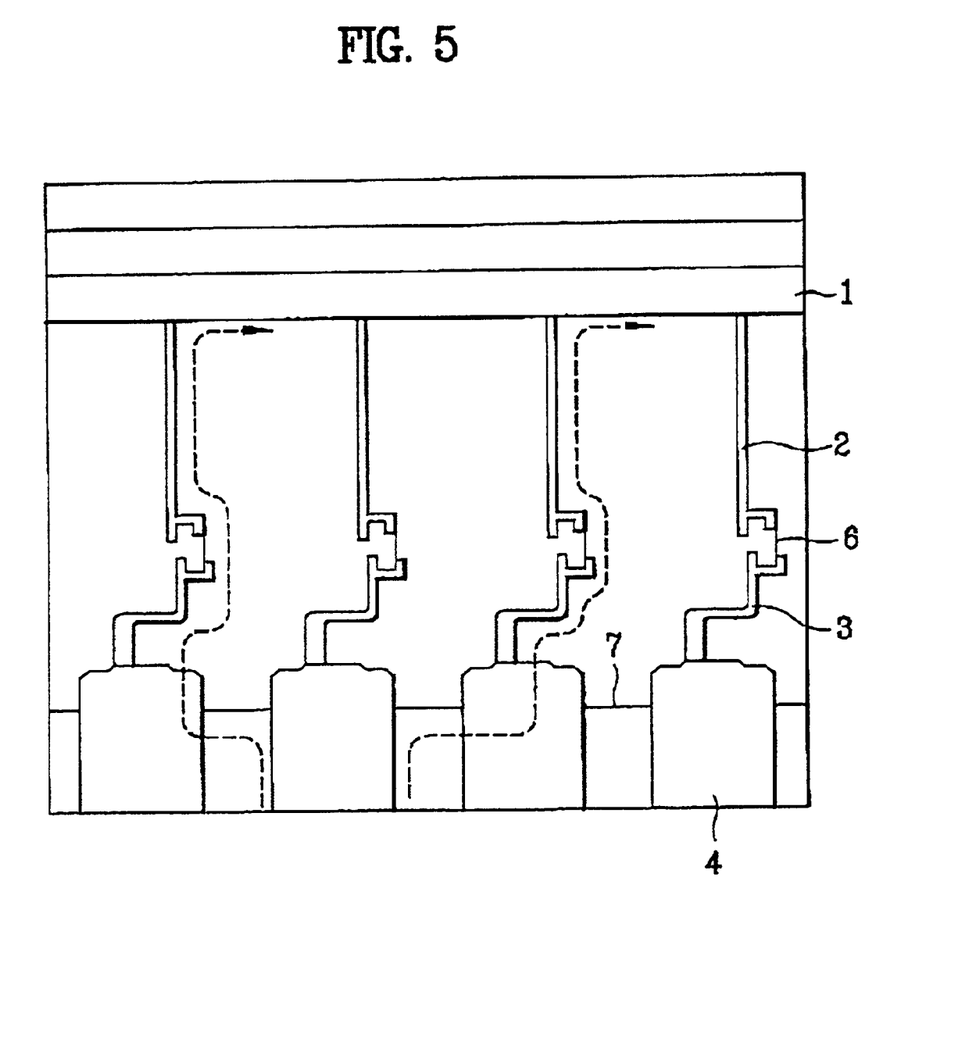
FIG. 5 illustrates a plan view of a photo mask for patterning a lightning rod in accordance with a first preferred embodiment.

FIG. 5 illustrates a plan view of a photo mask for patterning a lightning rod in accordance with a first preferred embodiment.

Referring to FIG. 5, the photo mask for patterning a lightning rod having a shorting bar pattern 1 and pad patterns 4 in accordance with a first preferred embodiment of the present invention includes an outer lightning rod pattern 2 connected to the shorting bar pattern 1, an inner lightning rod pattern 3 connected to a pad and formed to oppose the outer lightning rod, projections from each of the outer lightning rod pattern 2 and the inner lightning rod pattern 3 and a fine pattern 6 connected between the projections for protecting the photo mask against static electricity, and a redundancy fine pattern 7 connected between pad patterns 4.

Thus, the photo mask for patterning a lightning rod in accordance with a first preferred embodiment provides a redundancy fine pattern 7 so that the static electricity generated on an array side of the photo mask establishes an equipotential with an adjacent pad through the redundancy fine pattern 7 and is discharged to an outer periphery of the mask even if the fine pattern 6 formed between the lightning rods is broken. Accordingly, even if the fine pattern 6 formed between the lightning rods is short circuited, the photo mask can be protected from static electricity, thereby preventing the photo mask from suffering from damage.

Second Embodiment

Figure 6:
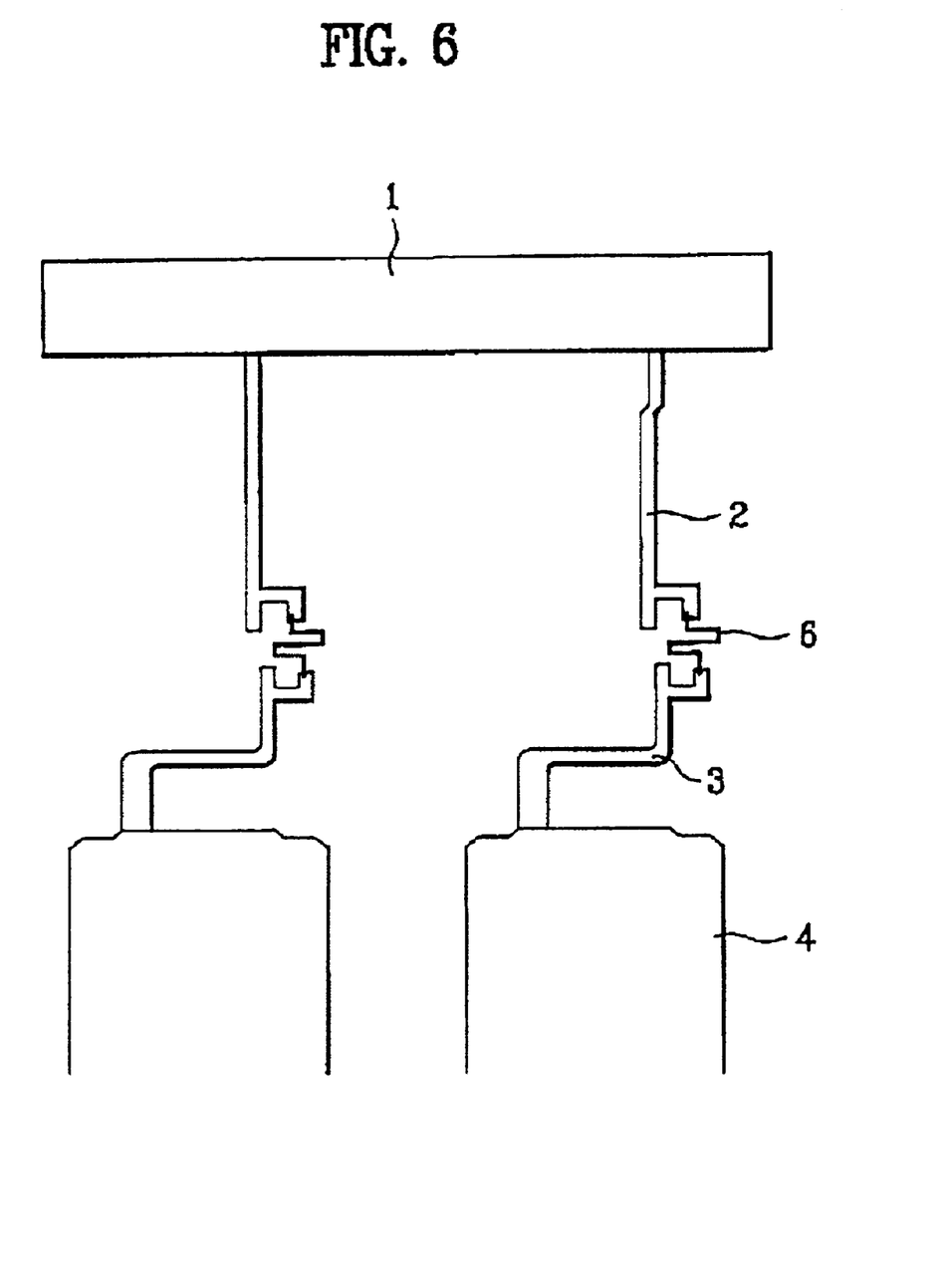
FIG. 6 illustrates a plan view of a photo mask for patterning a lightning rod in accordance with a second preferred embodiment.

FIG. 6 illustrates a plan view of a photo mask for patterning a lightning rod in accordance with a second preferred embodiment.

Referring to FIG. 6, the photo mask for patterning a lightning rod having a shorting bar pattern 1 and pad patterns 4 in accordance with a second preferred embodiment of the present invention includes an outer lightning rod pattern 2 connected to the shorting bar pattern 1, an inner lightning rod pattern 3 connected to a pad and formed to oppose the outer lightning rod pattern, projections from each of the outer lightning rod pattern 2 and the inner lightning rod pattern 3 and a fine pattern 6 connected between the projections in a "ㅂ" form for protecting the photo mask against static electricity.

Thus, the photo mask for patterning a lightning rod in accordance with a second preferred embodiment discharges the static electricity generated on the cell array side to outside of the photo mask owing to a short spaced pattern of the photo mask itself, and further reduces a possibility of forming the fine pattern as an actual pattern on the device in an exposure/development and etching. That is, the fine pattern 6 in the "ㅂ" shape is involved in a greater interference and diffraction at bent parts than straight parts, such that the bent parts fail to form patterns, even if the straight parts do form patterns, providing a discontinuity to the pattern, that significantly reduces the possibility of occurrence of a short at the pads.

Third Embodiment

Figure 7:
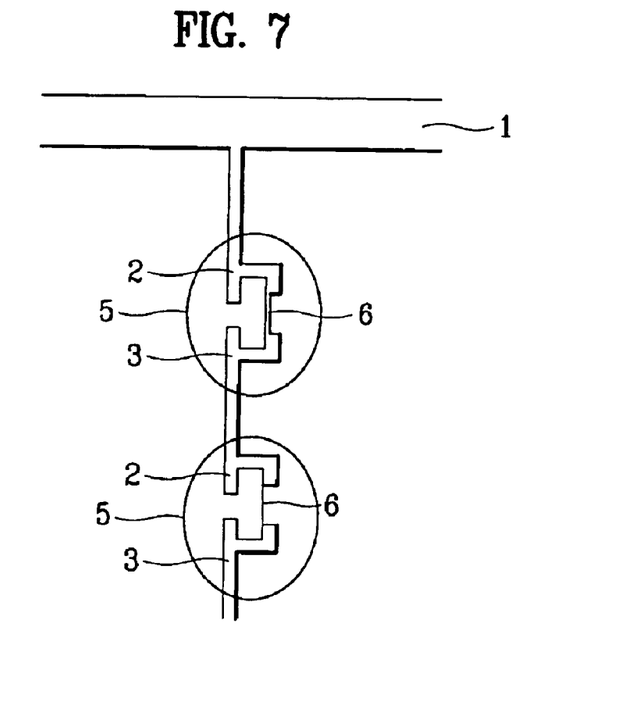
FIG. 7 illustrates a plan view of a photo mask for patterning a lightning rod in accordance with a third preferred embodiment.

FIG. 7 illustrates a plan view of a photo mask for patterning a lightning rod in accordance with a third preferred embodiment.

The photo mask for patterning a lightning rod in accordance with a third preferred embodiment of the present invention includes a plurality of lightning rods connected in series with reference to the related art photo mask. That is, there are a plurality of lightning rods 5 having a fine pattern 6 between each of the outer and inner lightning patterns 2 and 3 between the shorting bar pattern 1 and the pad patterns 4.

Thus, the photo mask for patterning a lightning rod in accordance with a third preferred embodiment can prevent a short circuit between pads even if any one of the plurality of the fine patterns is not formed in actual patterning by using the photo mask.

Fourth Embodiment

Figure 8:
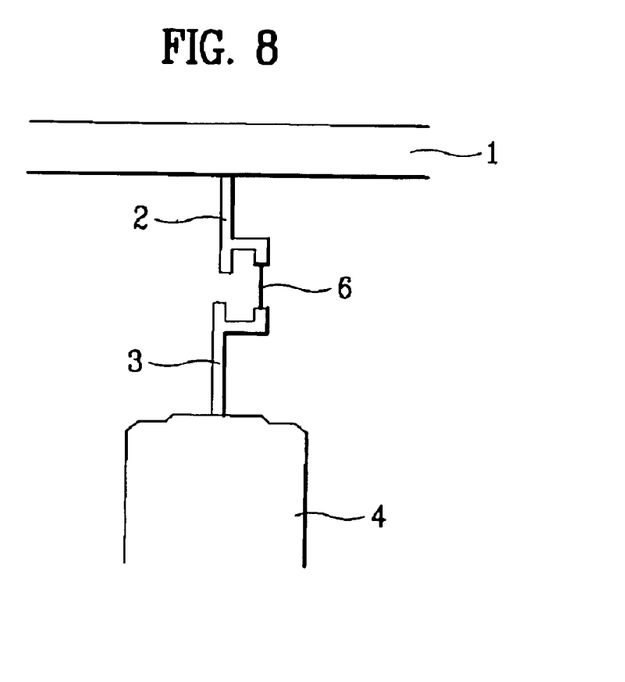
FIG. 8 illustrates a plan view of a photo mask for patterning a lightning rod in accordance with a fourth preferred embodiment.

FIG. 8 illustrates a plan view of a photo mask for patterning a lightning rod in accordance with a fourth preferred embodiment.

Referring to FIG. 8, the photo mask for patterning a lightning rod having a shorting bar pattern 1 and pad patterns 4 in accordance with a fourth preferred embodiment of the present invention includes an outer lightning rod pattern 2 connected to the shorting bar pattern 1, an inner lightning rod pattern 3 connected to a pad and formed to oppose the outer lightning rod, projections from each of the outer lightning rod pattern 2 and the inner lightning rod pattern 3 and a fine pattern 6 connected between centers of the projections for protecting the photo mask against static electricity.

Thus, the photo mask for patterning a lightning rod in accordance with a fourth preferred embodiment provides the fine pattern 6 connected to the projections at right angles at both ends thereof for causing more diffraction of light than the related art in the exposure, which further reduces the probability of forming the fine pattern in actual formation of the lightning rods on the glass substrate in the liquid crystal display, thereby preventing a short circuit.

Fifth Embodiment

Figure 9:
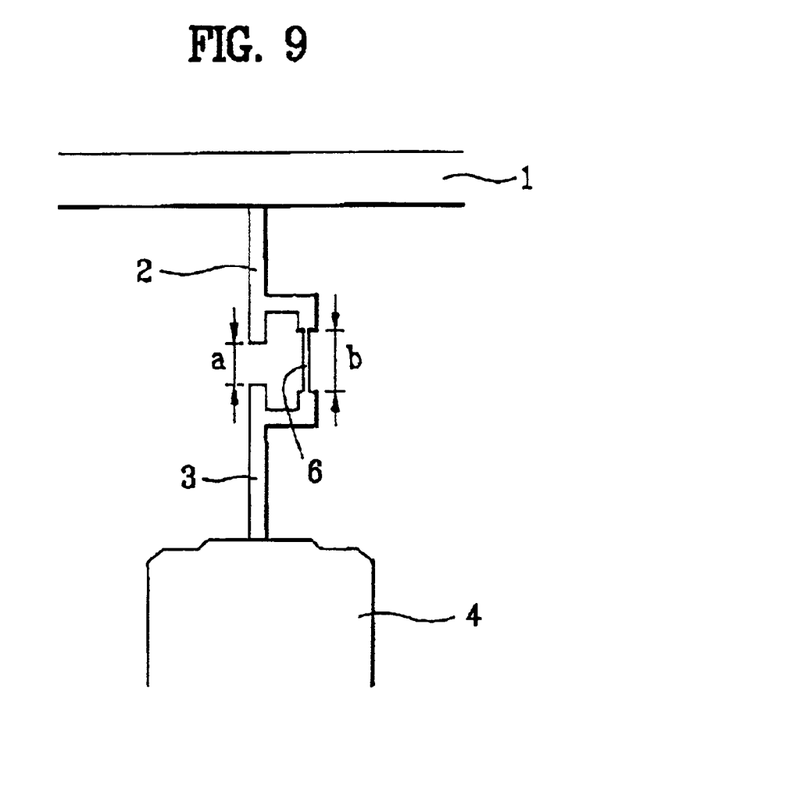
FIG. 9 illustrates a plan view of a photo mask for patterning a lightning rod in accordance with a fifth preferred embodiment.

FIG. 9 illustrates a plan view of a photo mask for patterning a lightning rod in accordance with a fifth preferred embodiment.

Referring to FIG. 9, the photo mask for patterning a lightning rod having a shorting bar pattern 1 and pad patterns 4 in accordance with a fifth preferred embodiment includes an outer lightning rod pattern 2 connected to the shorting bar pattern 1, an inner lightning rod pattern 3 connected to a pad and formed to oppose the outer lightning rod, projections from each of the outer lightning rod pattern 2 and the inner lightning rod pattern 3 and a fine pattern 6 connected between the projections for protecting the photo mask against static electricity. In this instance, a distance 'a' between the lightning rods are substantially less than a distance 'b' between the projections. That is, the photo mask is formed such that distance 'a'<distance 'b', for preventing formation of an undesired lightning rod even if the projections are deformed by the development and the etching.

Sixth Embodiment

Figure 10:
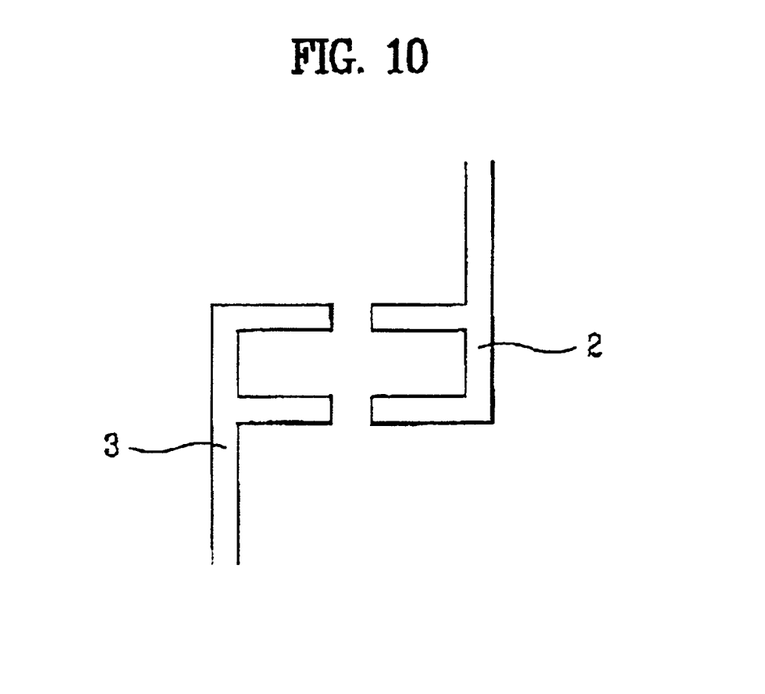
FIG. 10 illustrates a plan view of a photo mask for patterning a lightning rod in accordance with a sixth preferred embodiment; and, FIG. 11 illustrates a plan view of a photo mask for patterning a lightning rod in accordance with a seventh preferred embodiment.

FIG. 10 illustrates a plan view of a photo mask for patterning a lightning rod in accordance with a sixth preferred embodiment.

Referring to FIG. 10, different from the first, second, third, fourth, or fifth embodiment, the photo mask for patterning a lightning rod in accordance with a sixth preferred embodiment forms no fine pattern for protecting the photo mask from static electricity. That is, the outer lightning rod pattern and the inner lightning rod pattern are formed, not on the same photo mask, but on different photo masks, i.e., the outer lightning rod pattern 2 is formed on a photo mask for patterning a gate line, and the inner lightning rod pattern 3 is formed on a photo mask for patterning a data line. Thus, as the outer and inner lightning rod patterns are formed on different layers of photo masks, forming no lightning rod on an individual photo mask, the photo mask can be protected from suffering damage caused by the static electricity.

Seventh Embodiment

Figure 11:
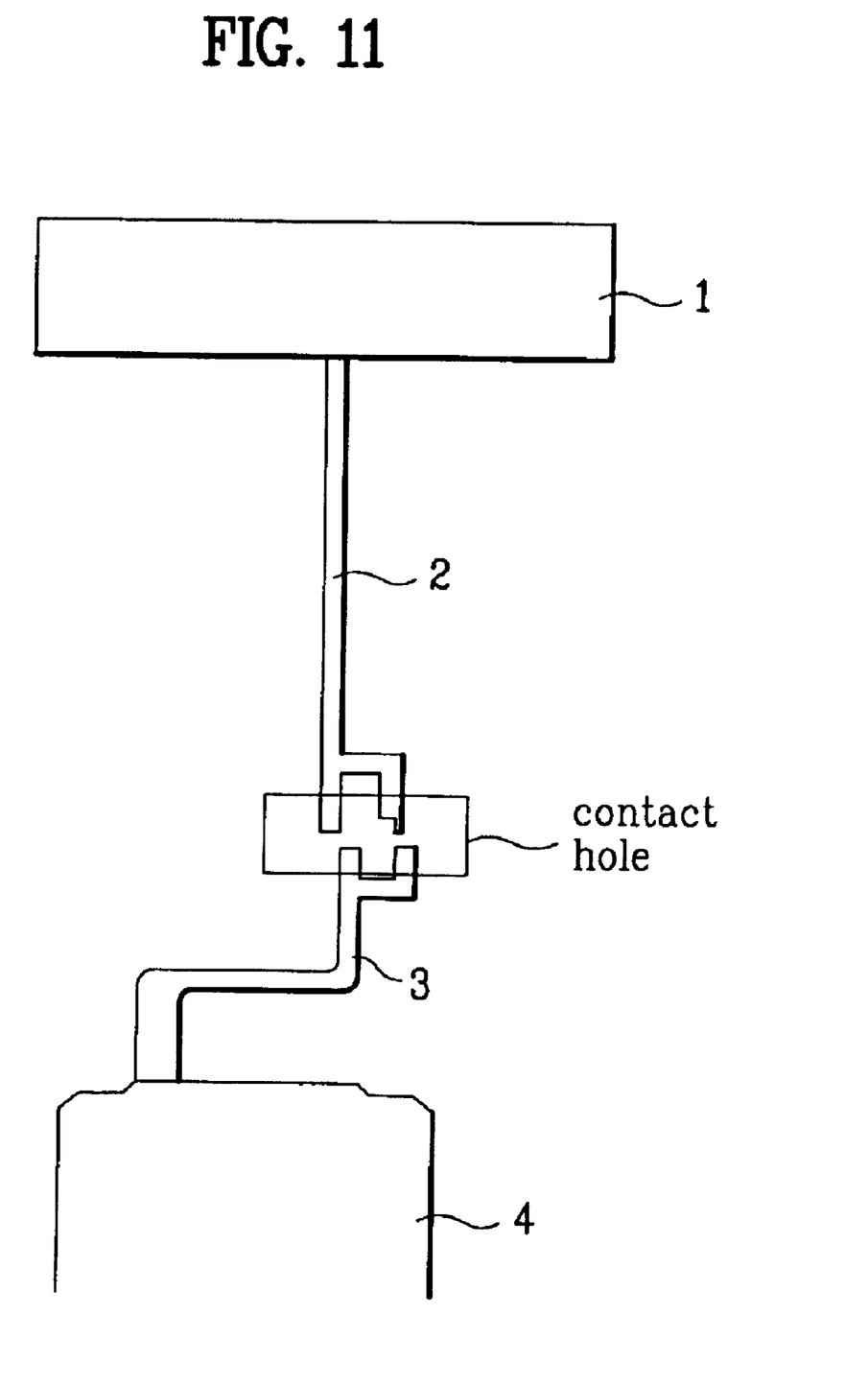

Finally, FIG. 11 illustrates a plan view of a photo mask for patterning a lightning rod in accordance with a seventh preferred embodiment.

Referring to FIG. 11, the photo mask for patterning a lightning rod in accordance with a seventh preferred embodiment forms the lightning rods by using the related art photo mask for patterning a lightning rod, formation of a contact hole pattern on a following photo mask corresponding to a position of the lightning pattern photo mask where the fine pattern 6 is formed, and the fine pattern 6 part is removed by using the photo mask having the contact hole pattern formed thereon. For an example, if the lightning rod pattern is formed on a photo mask for patterning a gate line, the contact hole pattern is formed on a photo mask for patterning a pixel electrode to be used in a subsequent process at a part of the fine pattern, and any possible fine pattern formed due to defective development and etching during formation of the lightning rod is removed during patterning the pixel electrode.

First, the formation of a redundancy fine pattern between pads in the first embodiment can protect the photo mask from suffering damage caused by static electricity as the static electricity can be protected against even if the fine pattern between the lightning rod portions is short circuited.

Second, the formation of the fine pattern in a right angled backward-S form in the second embodiment can reduce short circuits between pads significantly, because bent parts of the right angled backward-S form are not formed on the substrate, to produce a discontinuity, even if straight parts of the right angled backward-S form are formed, as interference and diffraction of lights are greater at the bent parts than the straight parts in exposure and development.

Third, the formation of a plurality of the lightning rods in series in the third embodiment can prevent a short between pads even if any one of the plurality of fine patterns are not formed.

Fourth, the connection between the fine pattern and the projections to be at right angles in the fourth embodiment can prevent short circuit of the pads because the right angle connection cause more diffraction of light in the exposure.

Fifth, the much greater distance 'b' between the projections than the distance 'a' between the lightning rods in the fifth embodiment can prevent formation of undesired lightning rod, even if the projections are deformed in the development and the etching.

Sixth, the formation of the outer lightning rod pattern and the inner lightning rod pattern on different photo masks, avoiding formation of the lightning rods on the same photo mask, in the sixth embodiment can prevent the photo mask from suffering damage caused by static electricity.

Seventh, the contact hole formed on a following photo mask at a position of a fine pattern between lightning rods in the precedent photo mask in the seventh embodiment can remove a possible fine pattern formed due to defective development and etching in a preceding photo mask.

It will be apparent to those skilled in the art that various modifications and variations can be made in the photo mask for patterning a lightning rod of the present invention without departing from the spirit or scope of the invention. Thus, it is intended that the present invention cover the modifications and variations of this invention provided they come within the scope of the appended claims and their equivalents.

What is claimed is:

1. A photo mask for patterning a lightning rod comprising:
    a shorting bar pattern and a plurality of pad patterns;
    an outer lightning rod pattern connected to the shorting bar pattern;
    an inner lightning rod pattern connected to one of the pad patterns;
    projections from each of the outer and inner lightning rod patterns, and a fine pattern connected between the projections; and,
    a redundancy fine pattern connected between the pad patterns.

2. A photo mask for patterning a lightning rod comprising:
    a shorting bar pattern and a plurality of pad patterns;
    an outer lightning rod pattern connected to the shorting bar pattern;
    an inner lightning rod pattern connected to one of the pad patterns; and,
    projections from each of the outer and inner lightning rod patterns, and a fine pattern connecting the projections, wherein the fine pattern comprises:
    three parallel lines, wherein one end of a first line is connected to one projection;
    the other end of the first line is connected to one end of the second parallel line by a vertical line substantially perpendicular to both the first and second parallel lines;
    the other end of the second parallel line is connected to an end of the third parallel line by a second vertical line substantially perpendicular to the second and third parallel lines; and
    the other end of the third parallel line is connected to the other protection.

3. A photo mask for patterning a lightning rod comprising:
    a shorting bar pattern and a plurality of pad patterns; and,
    a plurality of lightning rod patterns between the shorting bar pattern and each of the pad patterns.

4. A photo mask as claimed in claim 3, wherein each lightning rod pattern includes:
    an outer lightning rod pattern connected to the shorting bar pattern,
    an inner lightning rod pattern connected to the pad pattern, and
    projections from the outer lightning rod pattern and the inner lightning rod pattern, and a fine pattern connected between the projections.

5. A photo mask for patterning a lightning rod comprising:
    a shorting bar pattern and a plurality of pad patterns;
    an outer lightning rod pattern connected to the shorting bar pattern;
    an inner lightning rod pattern connected to one of the pad patterns; and,
    projections from each of the outer and inner lightning rod patterns, and a fine pattern connected between centers of the projections.

6. A photo mask as claimed in claim 5, wherein a distance between the projections is greater than a distance between the outer lightning rod pattern and the inner lightning rod pattern.

7. A photo mask set for patterning a lightning pattern comprising:
    a first photo mask having a shorting bar pattern and an outer lightning rod pattern connected to the shorting bar pattern formed thereon; and, a second photo mask having a pad pattern and an inner lightning rod pattern connected to the pad pattern formed thereon.

8. A photo mask set as claimed in claim 7, wherein the first photo mask is a photo mask for patterning a gate line, and the second photo mask is a photo mask for patterning a data line.

9. A photo mask set for patterning a lightning pattern comprising:
    a first photo mask including;
        a shorting bar pattern and a plurality of pad patterns,
        an outer lightning rod pattern connected to the shorting bar pattern,
        an inner lightning rod pattern connected to the pad pattern, and
        projections from each of the outer and inner lightning rod patterns, and a fine pattern connected between centers of the projections; and,
    a second photo mask having a contact hole at a position matched to the fine pattern on the first photo mask.

10. A photo mask set as claimed in claim 9, wherein the first photo mask is a photo mask for patterning a gate line, and the second photo mask is a photo mask for patterning a pixel electrode.

11. A photo mask for a liquid crystal display (LCD) panel, comprising:
    first and second pad patterns for signal lines of the LCD panel;
    first and second inner lightning rod patterns, each connected to a corresponding one of the first and second pad patterns;
    first and second inner lightning rod projections each extending from and connected to a corresponding one of the first and second inner lightning rod patterns;
    first and second outer lightning rod patterns;
    first and second outer lightning rod projections each extending from and connected to a corresponding one of the first and second outer lightning rod patterns;
    a shorting bar connected to the first and second outer lightning rod patterns;
    first and second fine patterns each connecting a corresponding one of the first and second inner lightning rod projections to a corresponding one of the first and second outer lightning rod projections; and
    a redundancy fine pattern connected between the first and second pad patterns.

12. A photo mask for a liquid crystal display (LCD) panel, comprising:
    a pad pattern for a signal line of the LCD panel;
    an inner lightning rod pattern connected to the pad pattern;
    an inner lightning rod projection extending from and connected to the inner lightning rod pattern;
    an outer lightning rod pattern;
    an outer lightning rod projection extending from and connected to the outer lightning rod pattern;
    a shorting bar connected to the outer lightning rod pattern; and
    a fine pattern connecting the inner lightning rod projection to the outer lightning rod projection, wherein a length of the fine pattern is substantially greater than a distance between the inner and outer lightning rod projections.

13. The photo mask of claim 12, wherein the fine pattern comprises:
    three parallel lines, wherein one end of a first line is connected to one projection;
    the other end of the first line is connected to one end of the second parallel line by a vertical line substantially perpendicular to both the first and second parallel lines;
    the other end of the second parallel line is connected to an end of the third parallel line by a second vertical line substantially perpendicular to the second and third parallel lines; and
    the other end of the third parallel line is connected to the other projection.

14. A photo mask for a liquid crystal display (LCD) panel, comprising:
    a pad pattern for a signal line of the LCD panel;
    a first inner lightning rod pattern connected to the pad pattern;
    a first inner lightning rod projection extending from and connected to the first inner lightening rod pattern;
    a first outer lightning rod pattern;
    a first outer lightning rod projection extending from and connected to the first outer lightning rod pattern;
    a second inner lightning rod pattern connected to the first outer lightning rod pattern;
    a second inner lightning rod projection extending from and connected to the second inner lightning rod pattern;
    a second outer lightning rod pattern;
    a second outer lightning rod projection extending from and connected to the second outer lightning rod pattern;
    a shorting bar connected to the second outer lightning rod pattern;
    a first fine pattern connecting the first inner lightening lightning rod projection to the first outer lightening lightning rod projection; and
    a second fine pattern connecting the second inner lightning rod projection to the second outer lightning rod projection.

15. A photo mask for a liquid crystal display (LCD) panel, comprising:
    a pad pattern for a signal line of the LCD panel;
    an inner lightning rod pattern connected to the pad pattern;
    an inner lightning rod projection extending from and connected to the inner lightning rod pattern;
    an outer lightning rod pattern;
    an outer lightning rod projection extending from and connected to the outer lightning rod pattern;
    a shorting bar connected to the outer lightning rod pattern; and
    a fine pattern connecting the inner lightning rod projection to the outer lightning rod projection, wherein a fine pattern extends from a center of the inner lightning rod projection to a center of the outer lightning rod projection.

16. A photo mask set for a liquid crystal display (LCD) panel, comprising:
    a first photo mask, including,
        a pad pattern for a signal line of the LCD panel;
        an inner lightning rod pattern connected to the pad pattern;
        an inner lightning rod projection extending from and connected to the inner lightning rod pattern;
        an outer lightning rod pattern;
        an outer lightning rod projection extending from and connected to the outer lightning rod pattern;

a shorting bar connected to the outer lightning rod pattern; and a fine pattern connecting the inner lightning rod projection to the outer lightning rod projection; and a second photo mask, including a pattern for a contact hole located at a position corresponding to a location of the fine pattern on the first photo mask.

17. A method of manufacturing a liquid crystal display (LCD) device, comprising:

providing an upper substrate and a lower substrate;

forming on the lower substrate a plurality of gate lines arranged in one direction at fixed intervals, a plurality of data lines arranged in another direction perpendicular to the direction of the gate line at fixed intervals to define pixel regions, a matrix of pixel regions each formed between the gate lines and the data lines;

forming a pixel electrode in each of the pixel regions;

forming a thin film transistor in each of the pixel regions, said thin film transistors having a gate electrode connected to the gate line, a source electrode connected to the data line, and a drain electrode connected to the pixel electrode, for being turned on/off in response to a signal on the gate line, to provide a signal on the data line to the pixel electrode;

forming pads at the ends of the data lines and the gate lines; and patterning a lighting rod for at least one of the pads using a photomask, wherein said photomask comprises:

a shorting bar pattern and a plurality of pad patterns;

an outer lightning rod pattern connected to the shorting bar pattern;

an inner lightning rod pattern connected to one of the pad patterns;

projections from each of the outer and inner lightning rod patterns, and a fine pattern connected between the projections; and, a fine pattern connected between the pad patterns.

* * * * *